United States Patent
Choi

(10) Patent No.: US 7,862,681 B2
(45) Date of Patent: Jan. 4, 2011

(54) PLASMA PROCESSING SYSTEM AND METHOD OF CONTOLLING THE SAME

(75) Inventor: Dae-Kyu Choi, Suwon-si (KR)

(73) Assignee: Gen Co., Ltd., Suwon-si (KR)

( * ) Notice: Subject to any disclaimer, the term of this patent is extended or adjusted under 35 U.S.C. 154(b) by 982 days.

(21) Appl. No.: 11/679,790

(22) Filed: Feb. 27, 2007

(65) Prior Publication Data

US 2007/0245962 A1   Oct. 25, 2007

(30) Foreign Application Priority Data

Apr. 21, 2006  (KR) .................. 10-2006-0036282

(51) Int. Cl.
  *H01L 21/306*  (2006.01)
  *B05C 11/00*   (2006.01)
(52) U.S. Cl. ............. 156/345.28; 118/712; 118/723 R
(58) Field of Classification Search ............ 118/712, 118/723 R, 723 I, 723 IR, 723 AN; 156/345.28, 156/345.48, 345.49; 315/111.51
See application file for complete search history.

(56) References Cited

U.S. PATENT DOCUMENTS

| | | | | |
|---|---|---|---|---|
| 5,468,296 A | * | 11/1995 | Patrick et al. ......... | 118/723 MP |
| 5,556,501 A | * | 9/1996 | Collins et al. ......... | 156/345.38 |
| 6,024,826 A | * | 2/2000 | Collins et al. ......... | 156/345.37 |
| 7,285,916 B2 | * | 10/2007 | Wi ....................... | 315/111.21 |
| 2003/0089680 A1 | * | 5/2003 | Johnson et al. ........ | 216/68 |
| 2004/0226658 A1 | * | 11/2004 | Lai et al. .............. | 156/345.48 |
| 2004/0237897 A1 | * | 12/2004 | Hanawa et al. ........ | 118/723 I |
| 2007/0145900 A1 | * | 6/2007 | Kirchmeier et al. .... | 315/111.21 |
| 2009/0288772 A1 | * | 11/2009 | Holber et al. ......... | 156/345.1 |

* cited by examiner

*Primary Examiner*—Luz L. Alejandro
(74) *Attorney, Agent, or Firm*—NSIP Law

(57) ABSTRACT

Provided is a plasma processing system comprising: a plasma reactor generating plasma by receiving an input gas; and a radio frequency generator supplying radio frequency. The radio frequency generator supplies radio frequency power for plasma generation to the plasma reactor, wherein upon power interruption within a predetermined time occurring during the operation of the plasma reactor, the radio frequency generator re-supplies the radio frequency power, without discontinuing the operation of the plasma reactor, after power returns. Thereby, the plasma reactor stably maintains plasma upon momentary power interruption.

13 Claims, 8 Drawing Sheets

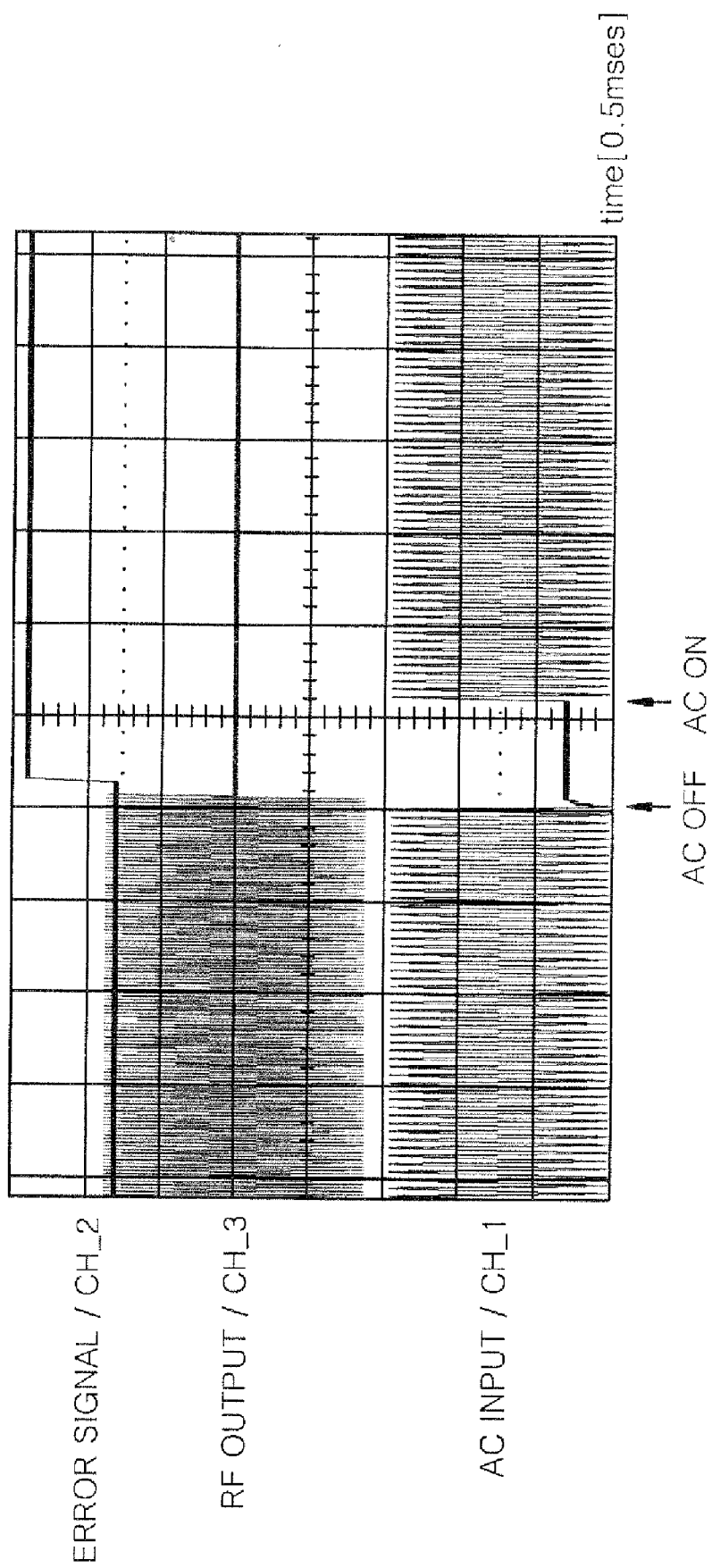

PLASMA PROCESSING SYSTEM AND METHOD OF CONTOLLING THE SAME

CROSS-REFERENCE TO RELATED APPLICATION

This application claims the benefit of Korean Patent Application No. 2006-36282, filed on Apr. 21, 2006, the disclosure of which is hereby incorporated herein by reference in its entirety.

BACKGROUND OF THE INVENTION

1. Technical Field

The present invention relates to a plasma processing system for generating an active gas containing ions, free radicals, atoms and molecules by plasma discharge and performing a plasma process onto a solid, powder and gas by the active gas.

2. Discussion of Related Art

Plasma discharge is used for gas excitation to generate an active gas containing ions, free radicals, atoms and molecules. The active gas is generally used in various fields, and typically, in semiconductor fabrication processes such as etching, deposition and cleaning.

Plasma sources for generating plasmas are various, and typical examples thereof are the capacitively coupled plasma source and the inductively coupled plasma source, both using the radio frequency. The inductively coupled plasma source relatively easily increases the ion density as the radio frequency power increases. Due to this reason, the inductively coupled plasma is suitable for generating high-density plasma.

However, since energy coupled with plasma is lower than supplied energy, a method for the inductively coupled plasma uses a driving coil with very high voltage. As a result, ion energy is high, and thus an inside surface of a plasma reactor is likely to be damaged by ion bombardment. The damage to the inside surface of the plasma reactor by the ion bombardment causes a negative result of acting as a pollution source in plasma processing. When lowering the ion energy, the energy coupled with plasma is getting much lower, thereby frequently occurring plasma to be off. This makes it difficult to stably maintain plasma.

Stable maintenance of plasma is a very important matter connected directly with productivity. When plasma is off during a process due to any reasons, the process fails. Then, it needs to again initialize the process to re-start the process. Specifically, when power supplied to a radio frequency generator is off due to unstable power supply such as a momentary power failure, the plasma of a plasma reactor is off, and the process is discontinued. Wafer substrates for fabrication of semiconductor devices or glass substrates for liquid crystal displays have become larger. In this situation, a loss rate resulting from a single process failure gets higher.

In a semiconductor fabrication process, specifically, in a process using plasma, remote plasma is very useful. For example, remote plasma is very valuably used in a cleaning process of a process chamber or an ashing process for a photoresist strip. As a substrate to be processed becomes larger, the volume of a process chamber increases. In this regard, a plasma source should be capable of sufficiently supplying a high-density active gas in a remote manner, and maintaining plasma very stably.

To generate and provide high-density plasma in large quantities, the volume of a plasma reactor also increases. A remote plasma reactor is generally installed above a process chamber. However, when the size of the reactor becomes bigger, it is not easy to install the reactor. Furthermore, it is more difficult to install a conventional plasma reactor which is formed as one unit with a radio frequency generator.

SUMMARY OF THE INVENTION

Therefore, the present invention is directed to provide a plasma processing system, which is capable of stably generating and maintaining high-density plasma, and a method of controlling the same.

Another object of the present invention is to provide a plasma processing system, which is capable of stably maintaining plasma of a plasma reactor when momentary interruption in power supply occurs, and a method of controlling the same.

In accordance with an exemplary embodiment, the present invention provides a plasma processing system including a plasma reactor for generating plasma by receiving an input gas; and a radio frequency generator for supplying radio frequency power for generating the plasma to the plasma reactor, and wherein, upon power interruption within a predetermined time occurring during an operation of the plasma reactor, the radio frequency generator re-supplies the radio frequency power to the plasma reactor so as not to discontinue the operation of the plasma reactor after power returns.

In an exemplary embodiment, upon power interruption exceeding the predetermined time, the radio frequency generator does not output the radio frequency power to the plasma reactor after power returns.

In an exemplary embodiment, the plasma processing system further comprises a system controller for controlling the whole plasma processing system. Upon the power failure exceeding the predetermined time, the radio frequency generator notifies the system controller of a power failure signal, and the system controller performs the system control to stop plasma-processing, in response to the notification of the power failure signal.

In an exemplary embodiment, the plasma processing system further comprises a process chamber for performing a predetermined plasma process by receiving an active gas generated in the plasma reactor.

In an exemplary embodiment, the radio frequency generator comprises a radio frequency generating circuit for generating a radio frequency power having predetermined frequency, a controller for controlling the whole radio frequency generator, and an input/output port for outside communication. When the power interruption occurs during the operation of the plasma reactor, the radio frequency generator is adapted, upon the power interruption within the predetermined time, not to generate the power failure signal and re-supplies the radio frequency power to the plasma reactor, without discontinuing the operation of the plasma reactor, after power returns and upon the power interruption exceeding the predetermined time, to generate the power failure signal and control re-starting the radio frequency output in response to a re-start signal as input.

In an exemplary embodiment, the radio frequency generating circuit comprises one or more switching semiconductor devices.

In an exemplary embodiment, the radio frequency generating circuit comprises one or more half bridge circuits.

In an exemplary embodiment, the plasma reactor comprises a reactor body with a plasma discharge chamber, a transformer having a magnetic core and a primary winding, the transformer installed in the reactor body so that an electromotive force for plasma generation is transferred to the plasma discharge chamber, and a radio frequency input terminal for receiving radio frequency supplied from the radio frequency generator, the radio frequency input terminal electrically connected with the primary winding, wherein a driving current of the primary winding induces AC potential inside the plasma discharge chamber forming inductively coupled plasma to complete a secondary circuit of the transformer.

In an exemplary embodiment, the reactor body comprises a metal material, and one or more electrically insulating regions having electrical discontinuity to prevent an eddy current.

In an exemplary embodiment, the plasma reactor comprises an ignition electrode for generating a free electric charge for plasma ignition in the plasma discharge chamber, and an ignition power source circuit for supplying ignition power to the ignition electrode.

In an exemplary embodiment, the reactor body comprises a cooling channel through which cooling fluid flows to control the temperature of the reactor body, a cooling error occurrence sensor for detecting an abnormal state of the flow of the cooling fluid in the cooling channel, and a temperature sensor for sensing the temperature of the reactor body.

In an exemplary embodiment, the plasma processing system comprises a system controller for controlling the whole plasma processing system. Here, the system controller controls the temperature of the reactor, based on sensing data as input through at least one of the cooling error occurrence sensor and the temperature sensor.

In an exemplary embodiment, the plasma reactor is a fixed type to be installed in the process chamber, and the radio frequency generator is a separable type to be separated from the plasma reactor. An output terminal of the radio frequency generator and an input terminal of the plasma reactor are connected with each other by a radio frequency cable, in a remote manner.

In an exemplary embodiment, the gas flowing into the plasma reactor is one selected from a group of an inactive gas, a reaction gas, a mixture of the inactive gas and the reaction gas.

BRIEF DESCRIPTION OF THE DRAWINGS

The above and other features and advantages of the present invention will become more apparent to those of ordinary skill in the art by describing in detail a preferred embodiment thereof with reference to the attached drawings in which:

FIG. 8 is a timing diagram for explaining a method of coping with momentary power interruption in a conventional plasma processing system.

DETAILED DESCRIPTION OF THE INVENTION

The present invention will now be described more fully hereinafter with reference to the accompanying drawings, in which a preferred embodiment of the invention is shown. This invention may, however, be embodied in different forms and should not be construed as limited to the embodiment set forth herein. Rather, the embodiment is provided as a teaching example of the invention. Like numbers refer to like element. Where the function and structure are well-known in the relevant arts, further discussion will not be presented in the detailed description or illustration of the present invention in order not to unnecessarily make the gist of the invention unclear.

Figure 1:
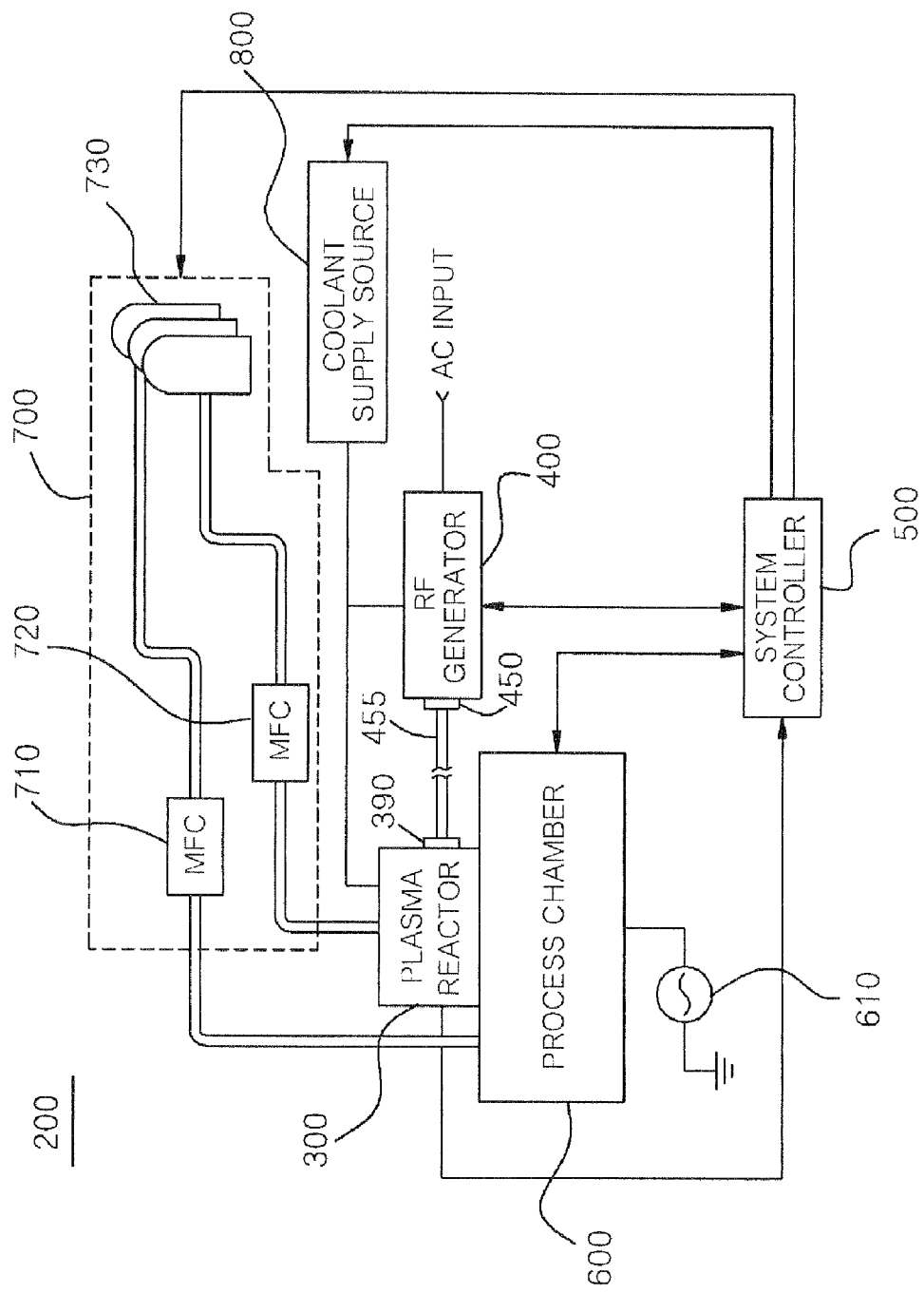
FIG. 1 is a block diagram of a plasma processing system in accordance with an embodiment of the present invention.

FIG. 1 is a block diagram of a plasma processing system 200 in accordance with an embodiment of the present invention.

As illustrated in FIG. 1, the plasma processing system 200 comprises a plasma reactor 300 for generating plasma by receiving an input gas, and a radio frequency generator 400. The plasma reactor 300 is mounted on a process chamber 600. For example, the plasma reactor 300 may be installed outside the ceiling of the process chamber 600. The plasma reactor 300 receives radio frequency from the radio frequency generator 400 and generates plasma by using the gas supplied by a gas supply system 700.

The process chamber 600 performs a predetermined plasma process by receiving an active gas generated in the plasma reactor 300. The process chamber 600 may be, for example, a deposition chamber for performing a deposition process, an etching chamber for performing an etching process, or an ashing chamber for stripping photoresist. Otherwise, the process chamber 600 may be a plasma-processing chamber for performing a various semiconductor fabrication process.

The gas supply system 700 comprises a gas supply source 730 with various gases and a number of flow controllers 710. A gas which flows into the plasma reactor 300 is selected from a group of an inactive gas, a reactive gas and a mixture of the inactive gas and the reactive gas. Various gases selected from the gas supply system 700 according to the processes performed in the process chamber are supplied to the process chamber 600.

A coolant supply source 800 supplies coolant to the plasma reactor 300 and the radio frequency generator 400. A system controller 500 controls the whole plasma processing system 200.

Figure 2:
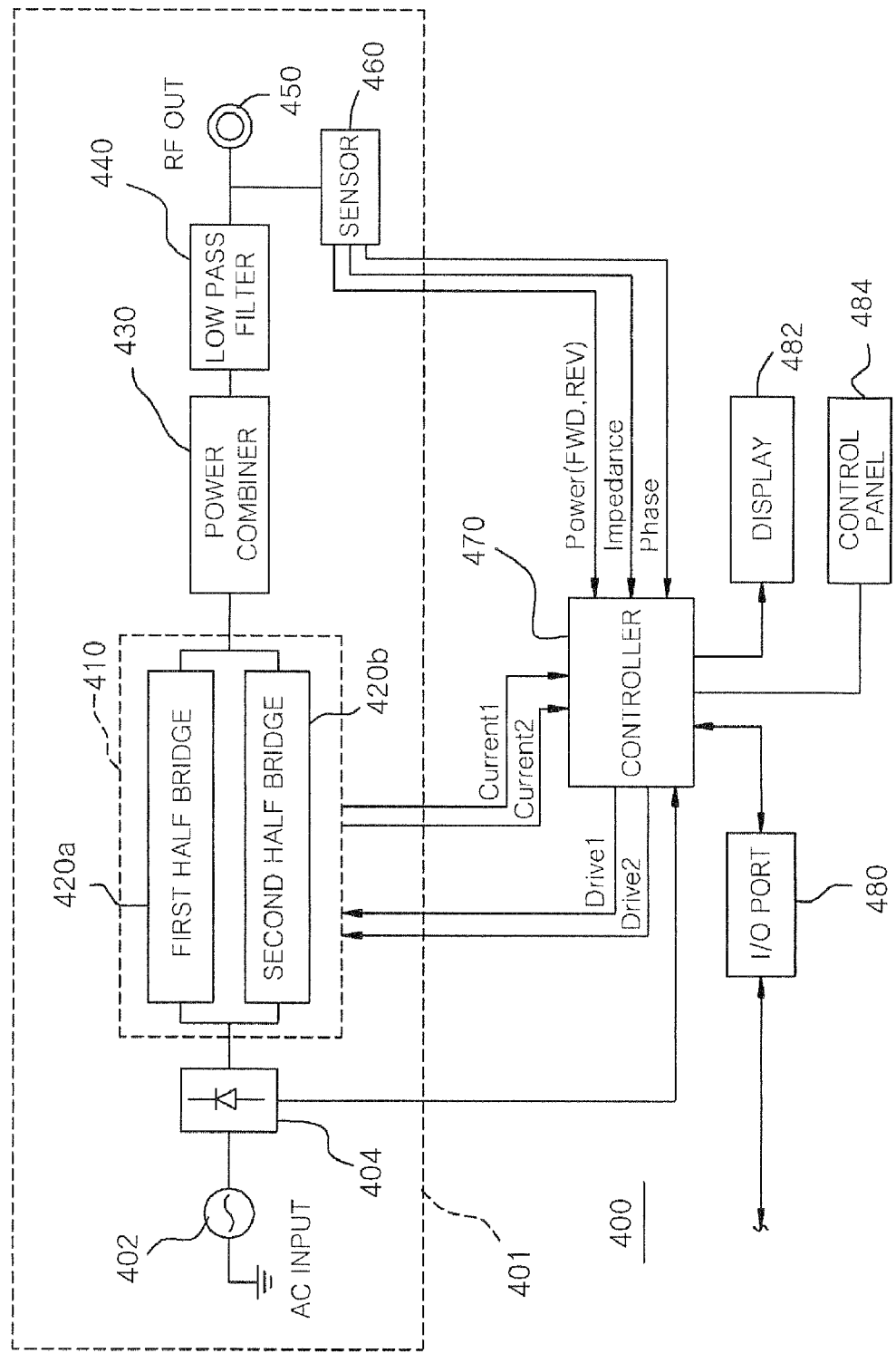
FIG. 2 is a block diagram of a circuit configuration of a radio frequency generator.

FIG. 2 is a block diagram of the circuit configuration of the radio frequency generator 400.

As illustrated in FIG. 2, the radio frequency generator 400 comprises a radio frequency generating circuit 401 for generating radio frequency power of a predetermined frequency, a controller 470 for controlling the whole radio frequency generator and an input/output port 480 for outside communication. The radio frequency generator 400 further comprises a display 482 for displaying an operation state and a control panel 484 for indicating an operation.

Specifically, the radio frequency generating circuit 401 comprises a rectifier 404 for rectifying an AC power as input, a radio frequency converter 410 for converting the rectified power into radio frequency, a radio frequency output terminal 450 for outputting the radio frequency, a low pass filter 440 connected between the radio frequency converter 410 and the radio frequency output terminal 450, a power combiner 430 connected between the radio frequency converter 410 and the low pass filter 440, and a sensor circuit 460 for detecting progressive wave, reflected wave, impedance and phase of the radio frequency. The radio frequency converter 410 comprises one or more half bridge circuits 420a and 420b composed of one or more switching semiconductor devices. The input/output port 480 is connected between the controller 470 and the system controller 500.

The controller 470 controls the driving of the radio frequency converter 410 by detecting the progressive wave, reflected wave, impedance and phase of the radio frequency by the sensor circuit 460 and detecting the value of a current of the radio frequency converter 410.

Specifically, when power interruption of an AC power source 402 occurs for a predetermined time (for example, 1 second) by a momentary power failure, the controller 470 controls the plasma reactor 300 so as not to discontinue generating plasma, so that stable plasma generation can be performed. Coping with the power interruption within the predetermined time occurring during the operation of the plasma reactor 300, after power returns, the radio frequency power is re-supplied to the plasma reactor without discontinuing the operation of the plasma reactor. That is, when the power interruption occurs during the operation of the plasma reactor, the controller 470 does not generate a power failure signal for the power interruption occurring within the predetermined time and, after power returns, re-supplies the radio frequency power without discontinuing the operation of the plasma reactor 300.

However, when outside power interruption occurs in excess of the predetermined time, the controller 470 monitoring the power state generates the power failure signal and outputs the power failure signal through the input/output port 480. Then, in response to the input of a re-start signal provided from the system controller 500, the controller 470 controls the radio frequency output to be re-started.

Figure 3:
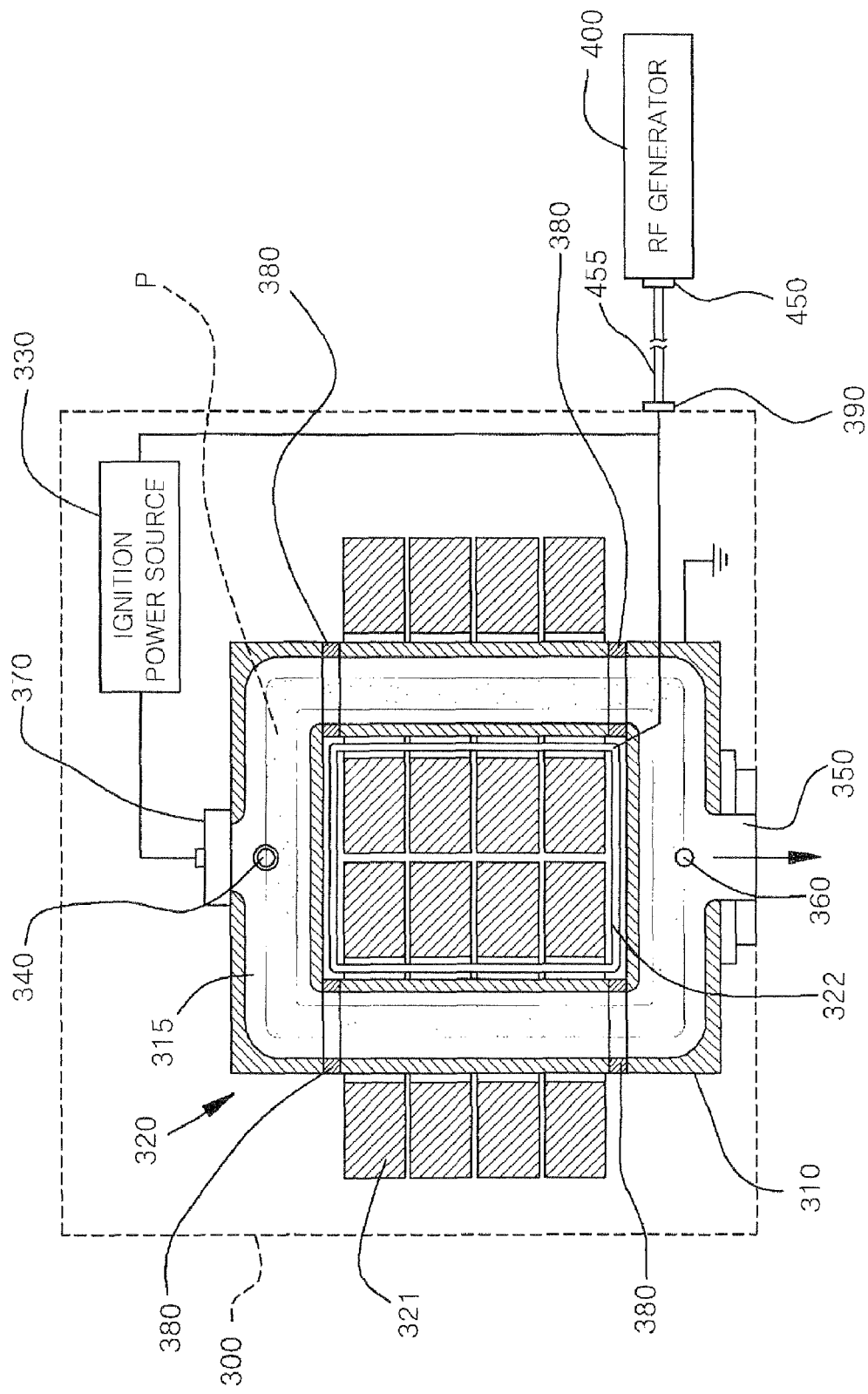
FIG. 3 is a cross-sectional view of a constitution of a plasma reactor.

FIG. 3 is a cross-sectional view of the constitution of the plasma reactor 300.

As illustrated in FIG. 3, the plasma reactor 300 comprises a reactor body 310 with a plasma discharge chamber 315. A transformer 320 comprises a magnetic core 321 and a primary winding 322 to be installed in the reactor body, so that an electromotive force is transferred to the plasma discharge chamber 315 for plasma generation. A radio frequency input terminal 390 is electrically connected with the primary winding 322 and receives the radio frequency supplied from the radio frequency generator 400. A driving current of the primary winding 322 induces AC potential inside the plasma discharge chamber 315 to form toroidal inductively coupled plasma P, thereby completing a secondary circuit of the transformer 320.

The reactor body 310 is made of a metal material such as aluminium, stainless or copper. It may be also made of a coated metal, for example, anodized aluminium or aluminium coated with nickel. It may be also made of a refractory metal. Alternatively, the reactor body 310 may be made of an insulating material such as quartz or ceramic, and it may be made of other materials suitable to perform an intended plasma process. When the reactor body 310 contains a metal material, the reactor body 310 comprises one or more electrically insulating region 380 having electrical discontinuity to minimize the eddy current. The insulating region 380 is made of an electrically insulating material such as quartz or ceramic.

The plasma reactor 300 comprises an ignition electrode 370 for generating a free electric charge for plasma ignition inside the plasma discharge chamber 315, and an ignition power circuit 330 for supplying ignition power to the ignition electrode 370. The ignition power circuit 330 generates the ignition power, using the radio frequency power as input through the radio frequency input terminal 390. The ignition electrode 370 is installed on the top of the reactor body 310.

The reactor body 310 generally has a structural shape suitable for the toroidal plasma P. A gas entrance 340 is open at an upper part of the reactor body 310 and is positioned to be close to the ignition electrode 370. A gas exit 350 for outputting the active gas is positioned at a lower part of the reactor body 310. The gas exit 350 may be made of, specially, brass or stainless steel.

The reactor body 310 comprises a cooling channel (not shown) through which a cooling fluid flows to control the temperature of the reactor body 310. The reactor body 310 also comprises a cooling error occurrence sensor (not shown) for sensing an abnormal state of a flow of the cooling fluid in the cooling channel, and a temperature sensor 360 for sensing the temperature of the reactor body 310. Preferably, the temperature sensor 360 may be positioned to be close to the gas exit 350 where the temperature is highest in the reactor body 310.

The system controller 500 controls the temperature of the plasma reactor 300, based on sensing data as input through the cooling error occurrence sensor (not shown) and/or the temperature sensor 360. When a cooling error occurs, the system controller 500 does not operate the plasma reactor 300.

Specifically, the plasma reactor 300 is separated from the radio frequency generator 400. That is, the plasma reactor 300 is fixedly installed in the process chamber 600, and the radio frequency generator 400 is separable from the plasma reactor 300. The output terminal 450 of the radio frequency generator 400 is connected with the radio frequency input terminal 390 of the plasma reactor 300 by a radio frequency cable 455, in a remote manner. Unlike a conventional constitution in which a radio frequency generator and a plasma reactor are formed in one unit, the plasma reactor 300 is very easily installed in the process chamber 600, and the efficiency of maintenance and management of the plasma processing system is increased.

Figure 4:
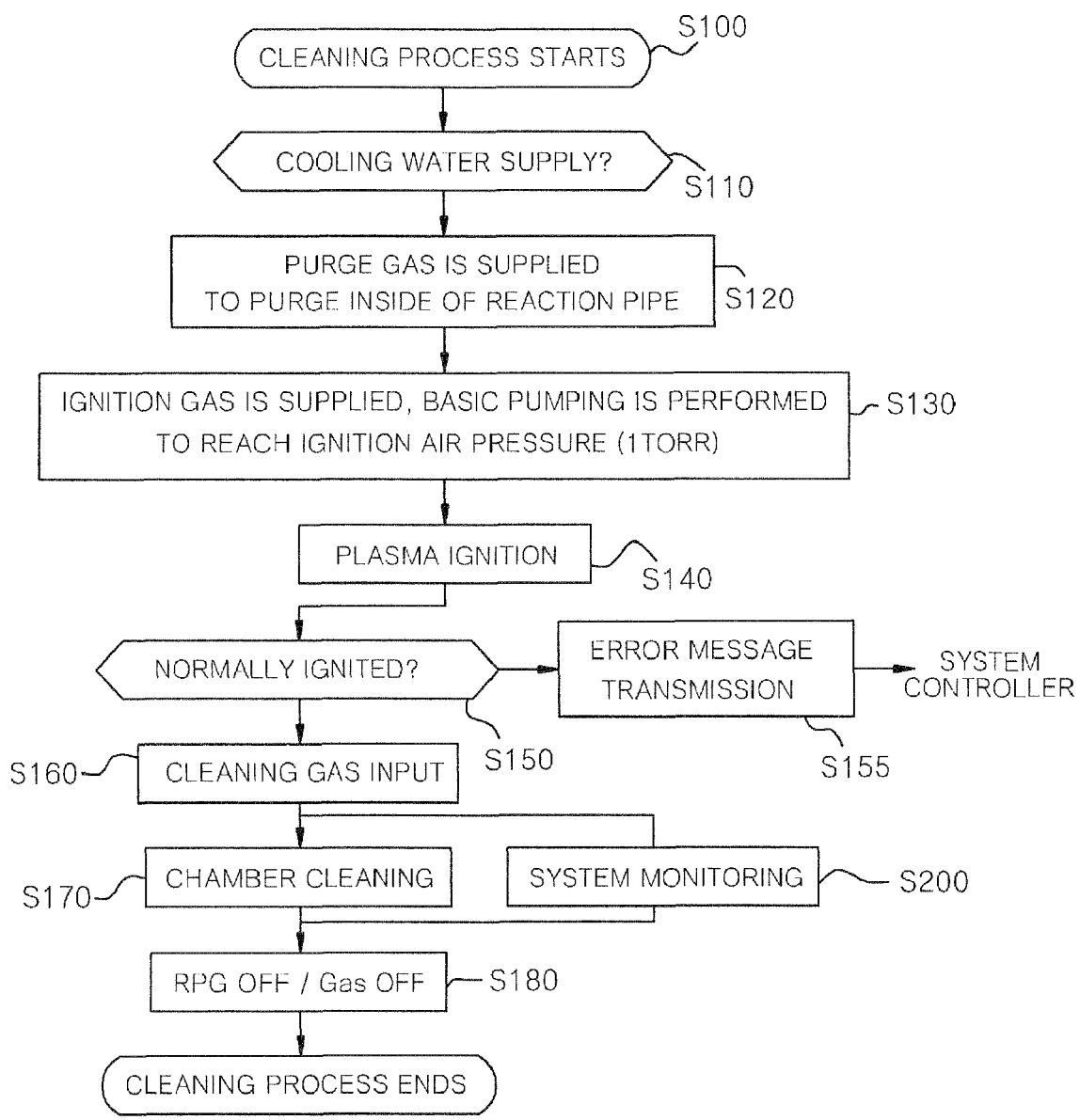
FIG. 4 is a flow chart for explaining a cleaning process as an example of a process performed in the plasma processing system.

FIG. 4 is a flow chart for explaining a cleaning process as an example of a process performed in the plasma processing system.

As illustrated in FIG. 4, at S100, a cleaning process starts. At S110, it is checked if coolant is normally supplied. If the coolant is not normally supplied, the cleaning process is not progressed.

At S120, a purge gas is supplied to purge the inside of a reactor pipe of the plasma reactor 300. At S130, an ignition gas is supplied to the plasma reactor 300, so that basic pumping is performed to reach ignition air pressure (for example, 1 Torr). Subsequently, at S140, plasma ignition is performed. When the ignition is not normally performed, at S155 an error message is transmitted to the system controller 500.

When the ignition is normally performed, at S160 a cleaning gas is supplied. The cleaning gas is resolved as an active gas in the plasma reactor 300, and the active gas is supplied to the process chamber 600. At S170, the active gas performs cleaning of the chamber. At S200, the progress state of the process and the system are monitored. When the chamber cleaning is completed, at S180 the plasma reactor 300 is off and the gas supply is stopped.

While the plasma reactor is operating as in the chamber cleaning process, it is very important to stably maintain plasma. When the radio frequency is supplied while plasma is off, serious damage is caused. Due to this reason, in a conventional art, when plasma is off, it needs to stop supplying the radio frequency and progressing the process.

However, in the present invention, at S200 of the system monitoring, specifically, when plasma is off in the plasma reactor 300 due to the power interruption, i.e., when a momentary power failure occurs, plasma can be stably maintained in the plasma reactor 300 for a momentary power failure within a predetermined time.

Figure 5:
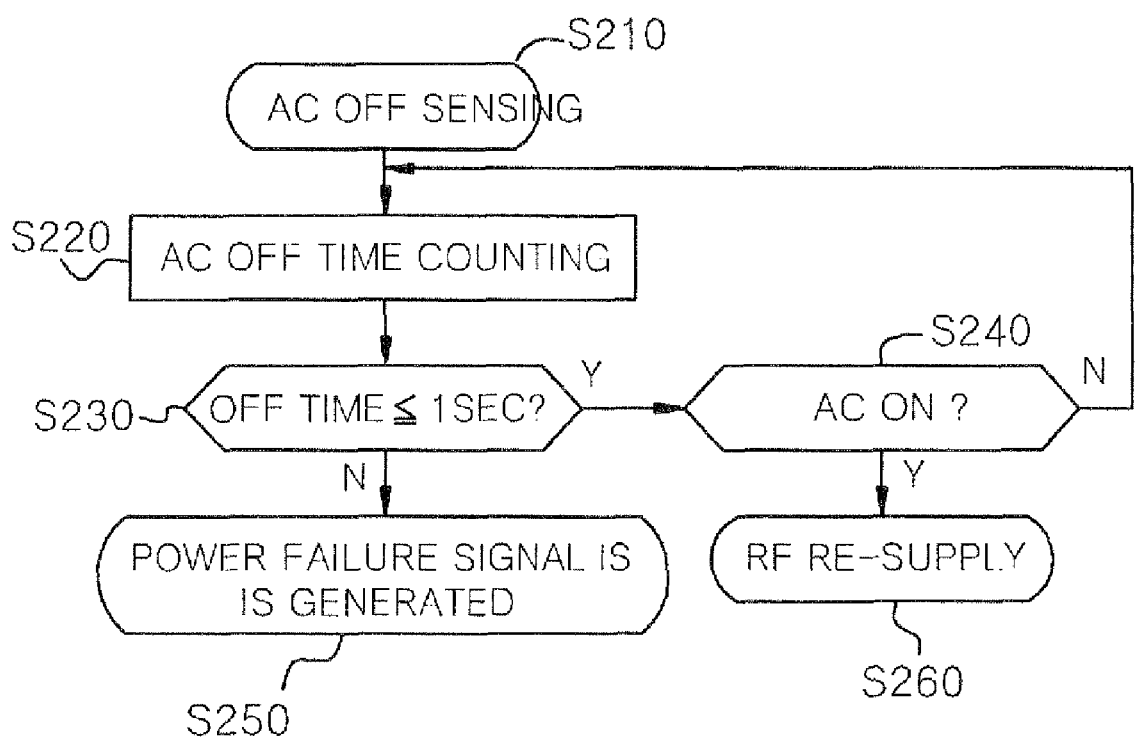
FIG. 5 is a flow chart illustrating a sequence of control to cope with power interruption.

FIG. 5 is a flow chart illustrating a sequence of control to cope with power interruption.

As illustrated in FIG. 5, when power interruption occurs, the controller 470 of the radio frequency generator 400 progresses the following process: When power interruption is sensed at S210, a power interruption time is counted at S220. At S230, it is determined whether the power interruption time exceeds a predetermined time (for example, 1 second). If power returns within the predetermined time at S240, radio frequency supply is re-started at S260. However, if the power interruption exceeding the predetermined time occurs, a power failure signal is generated and notified to the system controller 500 at S250.

Figure 6:
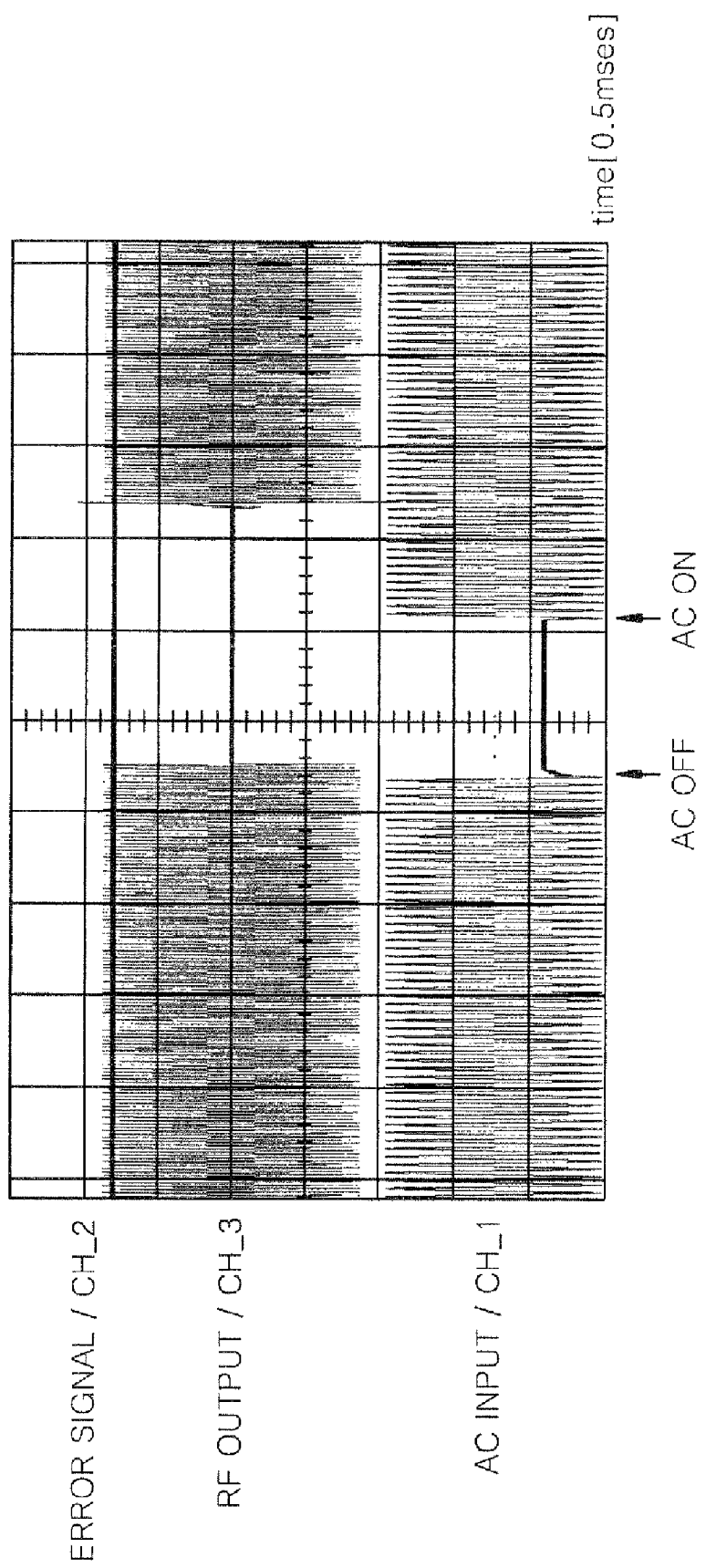
FIGS. 6 and 7 are timing diagrams for explaining methods of coping with momentary power interruption in the plasma processing system in accordance with the embodiment of the present invention.
Figure 7:
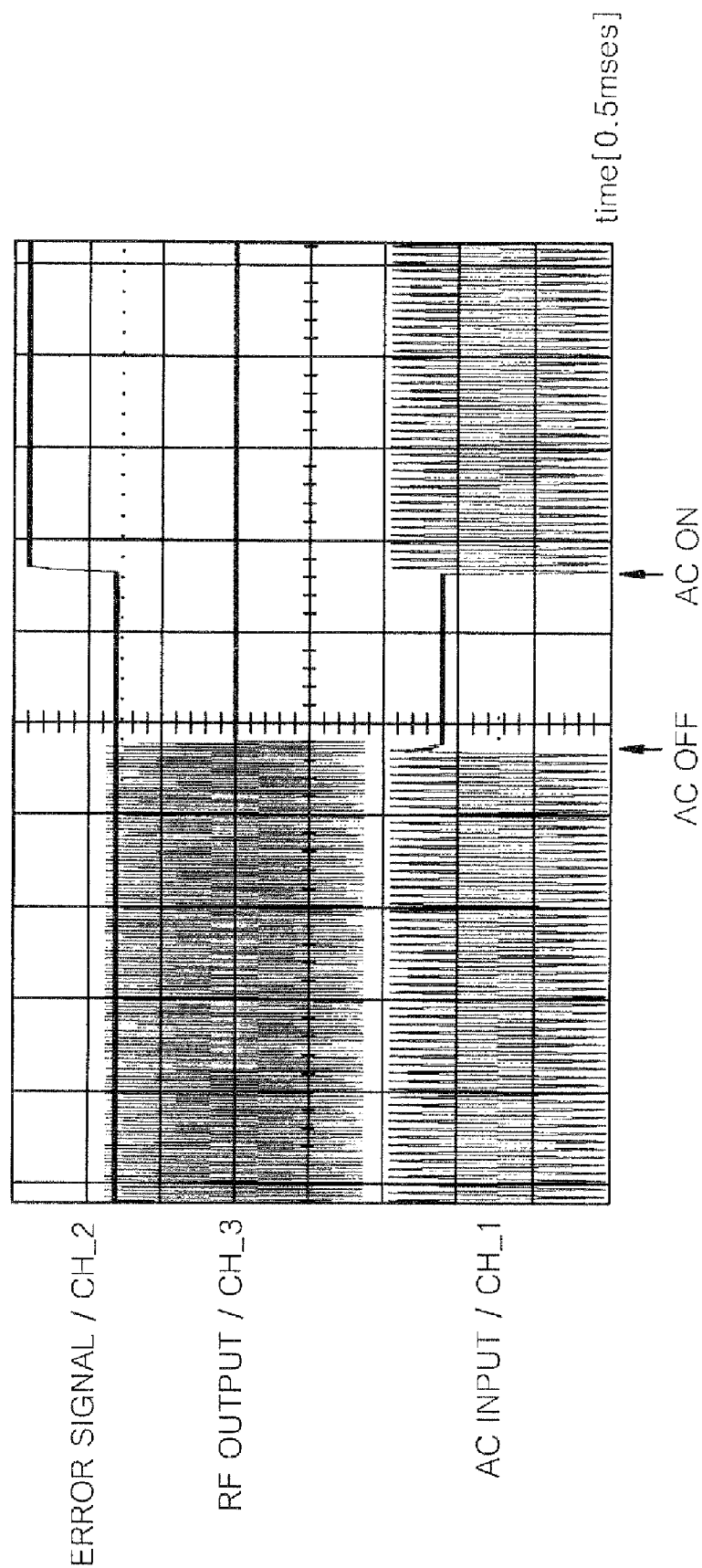

FIGS. 6 and 7 are timing diagrams for explaining methods of coping with momentary power interruption in the plasma processing system in accordance with the embodiment of the present invention; and FIG. 8 is a timing diagram for explaining a method of coping with momentary power interruption in a conventional plasma processing system.

As illustrated in FIG. 6, when the momentary power interruption within 1 second occurs, the radio frequency power is again normally supplied as power returns. However, as illustrated in FIG. 7, when the momentary power interruption exceeding 1 second occurs, the radio frequency is not output even though power returns.

However, as illustrated in FIG. 8, in a conventional plasma processing system, upon the power interruption within 1 second, the power failure signal is generated. That is, at a point in time when the power interruption occurs, the power interruption signal is immediately generated. Thus, the plasma processing is stopped in the case of momentary power interruption such as a momentary power failure. However, in the present invention, the plasma process is not stopped in the case of the momentary power interruption within 1 second, and the radio frequency is normally supplied when power returns.

Even though the radio frequency is not momentarily transferred to the plasma reactor due to the occurrence of momentary power interruption, the plasma is maintained because the energy transfer efficiency is high in the plasma reactor 300 of the present invention due to the inductively coupled mode.

As described above, in accordance with the plasma processing system and its control method of the present invention, high-density plasma is stably generated and maintained, and the plasma in the plasma reactor is also stably maintained when momentary interruption in power supply occurs. Thus, it is possible to prevent the progress of a process from being stopped for momentary power interruption such as a momentary power failure, thereby improving the productivity. In addition, the plasma reactor is easily installed and the efficiency of maintenance and management of the system is improved.

The invention has been described using a preferred exemplary embodiment. However, it is to be understood that the scope of the invention is not limited to the disclosed embodiment. On the contrary, the scope of the invention is intended to comprise various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A plasma processing system comprising:
    a plasma reactor for generating plasma by receiving an input gas; and
    a radio frequency generator for supplying radio frequency power for generating the plasma to the plasma reactor, the radio frequency generator comprising:
        a controller configured to measure the duration of a power interruption during operation of the plasma reactor, and compare the duration of the power interruption to a predetermined time;
        wherein, if the duration of the power interruption is within the predetermined time,
    the radio frequency generator re-supplies the radio frequency power to the plasma reactor so as not to discontinue the operation of the plasma reactor after power returns and; wherein, if the duration of power interruption exceeds the predetermined time, the radio frequency generator does not output the radio frequency power to the plasma reactor after power returns.

2. The plasma processing system according to claim 1, further comprising a system controller for controlling the whole plasma processing system,
    wherein upon the duration of the power interruption exceeding the predetermined time, the radio frequency generator notifies the system controller of a power failure signal, and
    the system controller performs system control to stop plasma-processing, in response to the notification of the power failure signal.

3. The plasma processing system according to claim 1, further comprising a process chamber for performing a predetermined plasma process by receiving an active gas generated in the plasma reactor.

4. The plasma processing system according to claim 1, wherein the radio frequency generator comprises a radio frequency generating circuit for generating a radio frequency power having predetermined frequency, and the controller is configured to control the whole radio frequency generator and an input/output port for outside communication;
    wherein when the power interruption occurs during the operation of the plasma reactor, the controller is adapted, if the duration of the power interruption is within the predetermined time, not to generate a power failure signal and re-supplies the radio frequency power to the plasma reactor, without discontinuing the operation of the plasma reactor, after power returns, and if the duration of the power interruption exceeds the predetermined time, to generate the power failure signal and control re-starting the radio frequency output in response to a re-start signal as input.

5. The plasma processing system according to claim 4, wherein the radio frequency generating circuit comprises one or more switching semiconductor devices.

6. The plasma processing system according to claim 4, wherein the radio frequency generating circuit comprises one or more half bridge circuits.

7. The plasma processing system according to claim 1, wherein the plasma reactor comprises:
    a reactor body with a plasma discharge chamber;
    a transformer having a magnetic core and a primary winding, the transformer installed in the reactor body so that an electromotive force for plasma generation is transferred to the plasma discharge chamber; and a radio frequency input terminal for receiving radio frequency supplied from the radio frequency generator, the radio frequency input terminal electrically connected with the primary winding, wherein a driving current of the primary winding induces AC potential inside the plasma discharge chamber forming inductively coupled plasma to complete a secondary circuit of the transformer.

8. The plasma processing system according to claim 7, wherein the reactor body comprises:

a metal material; and one or more electrically insulating regions having electrical discontinuity to prevent an eddy current.

9. The plasma processing system according to claim 7, wherein the plasma reactor comprises:

an ignition electrode for generating a free electric charge for plasma ignition in the plasma discharge chamber; and an ignition power source circuit for supplying ignition power to the ignition electrode.

10. The plasma processing system according to claim 7, wherein the reactor body comprises:

a cooling channel through which cooling fluid flows to control the temperature of the reactor body;

a cooling error occurrence sensor for detecting an abnormal state of the flow of the cooling fluid in the cooling channel; and a temperature sensor for sensing the temperature of the reactor body.

11. The plasma processing system according to claim 10, further comprising a system controller for controlling the whole plasma processing system, wherein the system controller controls the temperature of the plasma reactor, based on sensing data as input through at least one of the cooling error occurrence sensor and the temperature sensor.

12. The plasma processing system according to claim 1, wherein the plasma reactor is a fixed type to be installed in the process chamber, and the radio frequency generator is a separable type to be separated from the plasma reactor, and wherein an output terminal of the radio frequency generator and an input terminal of the plasma reactor are connected with each other by a radio frequency cable, in a remote manner.

13. The plasma processing system according to claim 1, wherein the gas flowing into the plasma reactor is one selected from a group of an inactive gas, a reaction gas, a mixture of the inactive gas and the reaction gas.

* * * * *